(12) United States Patent
Colvin et al.

(10) Patent No.: US 8,604,418 B2
(45) Date of Patent: Dec. 10, 2013

(54) IN-VACUUM BEAM DEFINING APERTURE CLEANING FOR PARTICLE REDUCTION

(75) Inventors: Neil K. Colvin, Merrimack, NH (US); Jincheng Zhang, Brighton, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 349 days.

(21) Appl. No.: 12/755,081

(22) Filed: Apr. 6, 2010

(65) Prior Publication Data

US 2011/0240889 A1 Oct. 6, 2011

(51) Int. Cl.
*B01D 59/44* (2006.01)

(52) U.S. Cl.
USPC ........................................................ 250/281

(58) Field of Classification Search
USPC ................. 250/281, 282, 284, 285, 288, 289, 250/492.1, 492.2, 492.21, 492.3; 134/1.1, 134/1.2
See application file for complete search history.

(56) References Cited

U.S. PATENT DOCUMENTS

| | | | | |
|---|---|---|---|---|
| 4,804,852 A * | 2/1989 | Rose et al. | ................. | 250/492.1 |
| 5,849,093 A * | 12/1998 | Andra | ........................... | 134/1.3 |
| 5,977,552 A * | 11/1999 | Foad | ........................ | 250/492.21 |
| 6,635,998 B2 * | 10/2003 | Tanaka et al. | ............ | 315/111.81 |
| 6,710,358 B1 * | 3/2004 | Chen et al. | ............... | 250/492.21 |
| 7,718,980 B2 * | 5/2010 | Tsukihara et al. | ....... | 250/492.21 |
| 7,947,129 B2 * | 5/2011 | Murata et al. | ................. | 134/1.1 |
| 2005/0016838 A1 * | 1/2005 | Murata et al. | ............ | 204/192.32 |
| 2007/0114456 A1 * | 5/2007 | Yasuda | .................... | 250/492.21 |
| 2007/0278427 A1 * | 12/2007 | Huang et al. | ............. | 250/492.21 |
| 2008/0141802 A1 * | 6/2008 | Smick et al. | ...................... | 74/27 |
| 2008/0245957 A1 * | 10/2008 | Gupta et al. | ............... | 250/252.1 |
| 2009/0114815 A1 * | 5/2009 | Vanderberg et al. | .......... | 250/288 |
| 2009/0267001 A1 * | 10/2009 | Huang | ..................... | 250/492.21 |
| 2011/0155921 A1 * | 6/2011 | Kellerman et al. | ....... | 250/396 R |

* cited by examiner

*Primary Examiner* — Robert Kim
*Assistant Examiner* — Jason McCormack
(74) *Attorney, Agent, or Firm* — Eschweiler & Associates, LLC

(57) ABSTRACT

A method is provided for reducing particle contamination in an ion implantation system, wherein an ion implantation system having source, mass analyzer, resolving aperture, decel suppression plate, and end station is provided. An ion beam is formed via the ion source, and a workpiece is transferred between an external environment and the end station for ion implantation thereto. A decel suppression voltage applied to the decel suppression plate is modulated concurrent with the workpiece transfer, therein causing the ion beam to expand and contract, wherein one or more surfaces of the resolving aperture and/or one or more components downstream of the resolving aperture are impacted by the ion beam, therein mitigating subsequent contamination of workpieces from previously deposited material residing on the one or more surfaces. The contamination can be mitigated by removing the previously deposited material or strongly adhering the previously deposited material to the one or more surfaces.

20 Claims, 3 Drawing Sheets

IN-VACUUM BEAM DEFINING APERTURE CLEANING FOR PARTICLE REDUCTION

FIELD OF THE INVENTION

The present invention relates generally to ion implantation systems, and more specifically to systems and methods for controlling particulate contamination in an ion implantation system.

BACKGROUND OF THE INVENTION

In the manufacture of semiconductor devices and other products, ion implantation systems are used to impart impurities, known as dopant elements, into semiconductor wafers, display panels, or other workpieces. Conventional ion implantation systems or ion implanters treat a workpiece with an ion beam in order to produce n- or p-type doped regions, or to form passivation layers in the workpiece. When used for doping semiconductors, the ion implantation system injects a selected ion species to produce the desired extrinsic material. For example, implanting ions generated from source materials such as antimony, arsenic, or phosphorus results in n-type extrinsic material wafers. Alternatively, implanting ions generated from materials such as boron, gallium, or indium creates p-type extrinsic material portions in a semiconductor wafer.

Conventional ion implantation systems include an ion source that ionizes a desired dopant element which is then accelerated to form an ion beam of prescribed energy. The ion beam is directed at a surface of the workpiece to implant the workpiece with the dopant element. The energetic ions of the ion beam penetrate the surface of the workpiece so that they are embedded into the crystalline lattice of the workpiece material to form a region of desired conductivity. The implantation process is typically performed in a high vacuum process chamber which prevents dispersion of the ion beam by collisions with residual gas molecules and which minimizes the risk of contamination of the workpiece by airborne particulates.

Ion dose and energy are two variables commonly used to define an ion implantation. The ion dose is associated with the concentration of implanted ions for a given semiconductor material. Typically, high current implanters (generally greater than 10 milliamps (mA) ion beam current) are used for high dose implants, while medium current implanters (generally capable up to about 1 mA beam current) are used for lower dose applications. Ion energy is used to control junction depth in semiconductor devices. The energy of the ions which make up the ion beam determine the degree of depth of the implanted ions. High energy processes, such as those used to form retrograde wells in semiconductor devices, typically require implants of up to a few million electron volts (MeV), while shallow junctions may only demand energies below 1 thousand electron volts (keV).

The continuing trend to smaller and smaller semiconductor devices requires implanters with ion sources that serve to deliver high beam currents at low energies. The high beam current provides the necessary dosage levels, while the low energy levels permit shallow implants. Source/drain junctions in complementary metal-oxide-semiconductor (CMOS) devices, for example, require such a high current, low energy application.

SUMMARY OF THE INVENTION

The present invention provides a method and a system for reducing particle contamination in an ion implantation system. The following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

The present invention is directed generally toward a method and a system for reducing particle contamination in an ion implantation system. In accordance with one exemplary aspect, an ion implantation system, such as a high-current ion implantation system, is provided having an ion source, a resolving aperture positioned proximate to an exit of a mass analyzer, and a decel suppression plate and/or aperture positioned downstream of the resolving aperture. An end station if further provided downstream of the resolving aperture and decel suppression plate, wherein the end station is configured to support a workpiece during an implantation of ions thereto. In one example, a plasma flood containment enclosure (also called a plasma flood assembly) and/or one or more ground reference apertures are further provided downstream of the resolving aperture prior to the end station.

In accordance with one exemplary aspect of the invention, an ion beam is formed via the ion source and mass-analyzed, wherein the ion beam is consequently passed through the resolving plate, decel suppression plate. A decel suppression voltage is applied to the decel suppression plate, therein selectively stripping electrons from the ion beam and focusing the ion beam. In one example, the workpiece is positioned in the end station and is implanted with ions from the ion beam, wherein the workpiece is subsequently removed from the end station to an external environment, and another workpiece is transferred into the end station for implantation. Concurrent with the transfer of the workpiece between the end station and the external environment, the decel suppression voltage is modulated, therein expanding and contracting a height and/or width of the ion beam. One or more surfaces of the resolving aperture, for example, are thus impacted by the expanding and contracting ion beam during the decel suppression voltage modulation, therein generally mitigating subsequent contamination of workpieces from previously deposited material residing on the one or more surfaces. For example, modulating the decel suppression voltage generally removes the previously deposited material from the one or more surfaces by sputtering the previously deposited material from the one or more surfaces. Alternatively, depending on the species, mass, and/or energy of the ion beam, for example, modulating the decel suppression voltage generally increases an adherence of the previously deposited material to the one or more surfaces.

In accordance with another exemplary aspect, the decel suppression voltage concurrently affects a removal of electrons from the ion beam and a focusing of the ion beam, wherein an effect of the modulation of the decel suppression voltage on the ion beam results in a net modulation of the height and/or width of the ion beam over a range of decel suppression voltages. Accordingly, the ion beam is generally expanded and contracted or "swept" across components positioned downstream of the resolving aperture. Accordingly, the expansion and contraction of the ion beam causes the ion beam to impact one or more surfaces of at least the resolving aperture, therein generally sputtering-clean previously deposited material, and/or strongly adhering or pasting the previously deposited material to the one or more surfaces, therein minimizing chances for delamination of the deposited material due to film stress.

According to still another example, a base of the plasma flood assembly or any downstream enclosure, for example, is cleaned by moving small particles or previously deposited material located on associated surfaces, such as between holes or openings in the plasma flood assembly, wherein the movement is enough to allow the particles to fall through the holes or openings.

According to another example, the decel suppression voltage is modulated between zero volts and an operating suppression voltage concurrent with the transfer of the workpieces into or out of the end station. In another example, the decel suppression voltage is cyclically varied for one or more cycles concurrent with the transfer of workpieces into or out of the end station.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
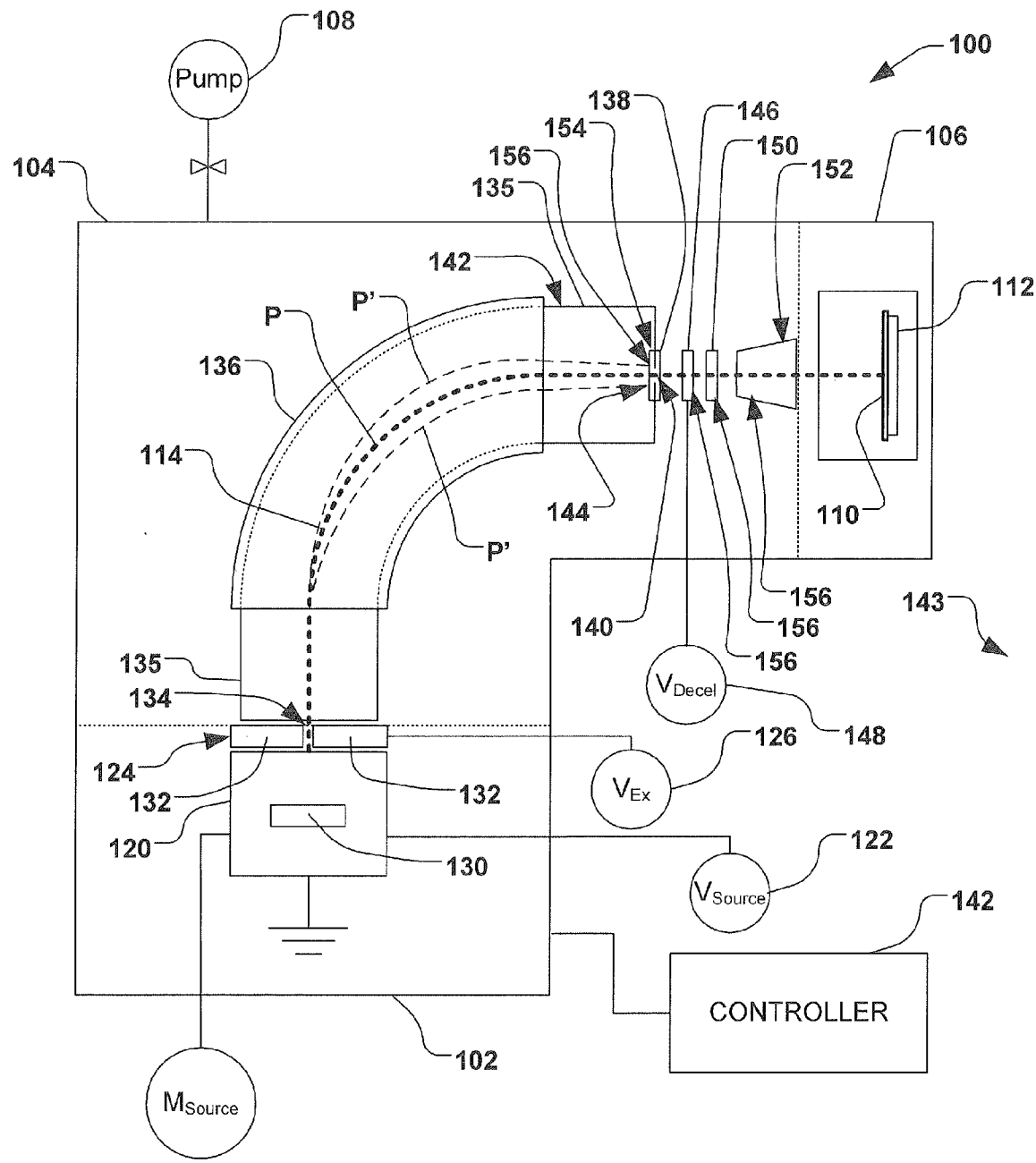
FIG. 1 is a plan view of an exemplary ion implantation system according to one aspect of the present invention.

The present invention is directed generally towards a system and method for reducing particle contamination associated with an implantation of ions into one or more workpieces. More particularly, the method provides an expansion and contraction of an ion beam in an ion implantation system after passing through a mass analyzer, wherein one or more surfaces of one or more downstream components are exposed to the expanded ion beam during a transfer of a workpiece into and/or out of an end station of the ion implantation system.

Accordingly, the present invention will now be described with reference to the drawings, wherein like reference numerals are used to refer to like elements throughout. It should be understood that the description of these aspects are merely illustrative and that they should not be taken in a limiting sense. In the following description, for purposes of explanation, numerous specific details are set forth in order to provide a thorough understanding of the present invention. It will be evident to one skilled in the art, however, that the present invention may be practiced without these specific details.

Figure 2:
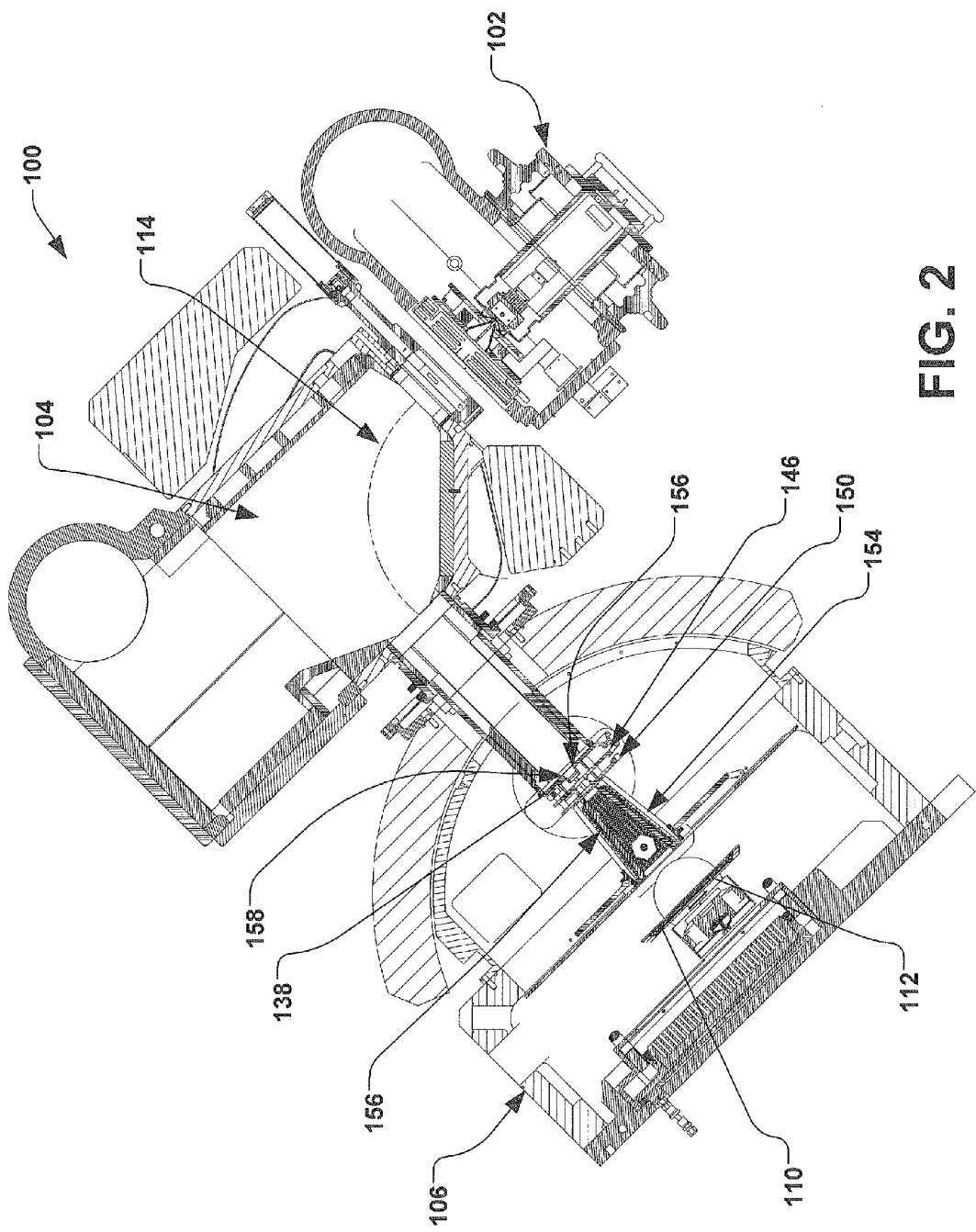
FIG. 2 is a detailed plan view of another exemplary ion implantation system according to another aspect of the invention.

Referring now to FIGS. 1 and 2, an exemplary ion implantation system 100 is schematically illustrated, wherein the exemplary ion implantation system is suitable for implementing one or more aspects of the present invention. It should be noted that although the ion implantation apparatus 100 is illustrated as one example, the present invention can be practiced using various other types of ion implantation apparatus and systems, such as high energy systems, low energy systems, or other implantation systems, and all such systems are contemplated as falling within the scope of the present invention.

The ion implantation system 100 of FIGS. 1 and 2, for example, comprises a terminal 102, a beamline assembly 104, and an end station 106 (e.g., collectively termed a process chamber), wherein the ion implantation system is generally placed under vacuum by one or more vacuum pumps 108 illustrated in FIG. 1. The ion implantation system 100, for example, is configured to implant ions into a workpiece 110 (e.g., a semiconductor wafer, display panel, etc.). In one example, the ion implantation system 100 is configured to implant ions into a single workpiece 110 (e.g., a "serial" ion implanter), wherein the workpiece generally resides on a support 112 (e.g., a pedestal or electrostatic chuck) situated within the end station 106. Alternatively, the ion implantation system 100 is configured to implant ions into multiple workpieces 110 (e.g., a "batch" ion implanter), wherein the end station 106 comprises a rotating platter (not shown), whereon several workpieces are translated with respect to an ion beam 114. It should be noted that any ion implantation apparatus operable to extract ions from an ion source and implant them into one or more workpieces is contemplated as falling within the scope of the present invention. The present invention, however, has shown particular usefulness in ion implantation systems 100 have relatively short beamline lengths (e.g., a high current ion implantation system).

The terminal 102, for example, comprises an ion source 120 powered by a source power supply 122, and an extraction assembly 124 powered by an extraction power supply 126 to extract ions from the ion source 120 via an extraction voltage $V_{Ex}$ applied thereto, thereby providing the extracted ion beam 114 to the beamline assembly 104. The extraction assembly 124, in conjunction with the beamline assembly 104, for example, are operable to direct the ions toward the workpiece 110 residing on the support 112 in the end station 106 for implantation thereof at a given energy level.

In one example, the ion source 120 comprises a plasma chamber (not shown) wherein ions of a process material $M_{source}$ are energized at a high positive potential $V_{source}$. It should be noted that generally, positive ions are generated, although the present invention is also applicable to systems wherein negative ions are generated by the source 120. The extraction assembly 124 further comprises a plasma electrode 130 and one or more extraction electrodes 132, wherein the plasma electrode is biased with respect to the one or more extraction electrodes, but floats with respect to the plasma within the ion source 120 (e.g., the plasma electrode at 120 kV with respect to the workpiece 110, wherein the workpiece is typically grounded). The one or more extraction electrodes 132, for example, are biased at a voltage less than that of the plasma electrode 130 (e.g., an extraction voltage $V_{Extract}$ of 0-100 kV). The negative relative potential at the one or more extraction electrodes 132 with respect to the plasma creates an electrostatic field operable to extract and accelerate the positive ions out of the ion source 120. For example, the one or more extraction electrodes 132 have one or more extraction apertures 134 associated therewith, wherein positively charged ions exit the ion source 120 through the one or more extraction apertures to form the ion beam 114, and wherein a velocity of the extracted ions is generally determined by the potential $V_{Extract}$ provided to the one or more extraction electrodes.

The beamline assembly 104, according to one exemplary aspect of the invention, comprises a beamguide 135 having an entrance near the ion source 120 (e.g., associated with the extraction aperture 134), a mass analyzer 136 that receives the extracted ion beam 114, and an exit with a resolving plate 138, wherein the mass analyzer generally creates a dipole magnetic field to significantly pass only ions of appropriate charge-to-mass ratio or range thereof (e.g., a mass analyzed ion beam having ions of a desired mass range) to the workpiece 110 positioned in the end station 106. In general, the ionization of source materials in the ion source 120 generates a species of positively charged ions having a desired atomic mass. However, in addition to the desired species of ions, the ionization process will also generate a proportion of ions having other atomic masses as well. Ions having an atomic mass above or below the proper atomic mass are not suitable for implantation and are referred to as undesirable species. The magnetic field generated by the mass analyzer 136 generally causes the ions in the ion beam 114 to move in a curved trajectory, and accordingly, the magnetic field is established such that only ions having an atomic mass equal to the atomic mass of the desired ion species traverse the beam path P to the end station 106.

In accordance with another aspect of the invention, the resolving plate 138 at the exit of the beamguide 135 of FIG. 1 operates in conjunction with the mass analyzer 136 in order to eliminate undesirable ion species from the ion beam 114 that have an atomic mass close, but not identical, to the atomic mass of the desired species of ions. The resolving plate 138, for example, is comprised of vitreous graphite or another material such as tungsten or tantalum, and includes one or more elongated apertures 140, wherein the ions in the ion beam 114 pass through the aperture as they exit the beamguide 135. At the resolving plate 138, a dispersion of ions from the path P of the ion beam 110 (e.g., illustrated at P') is at its minimum value, wherein a width of the ion beam (P'-P') is at a minimum where the ion beam 114 passes through the resolving aperture 140.

In one example, the strength and orientation of the magnetic field of the mass analyzer 136, as well as the velocity of the ions extracted from the ion source 120, is established by a controller 142, such that generally, only ions having an atomic weight equal to the atomic weight (or charge-to-mass ratio) of the desired species will traverse the predetermined, desired ion beam path P to the end station 106. The controller 142, in one example, is operable to control all aspects the ion implantation system 100. The controller 142, for example, is operable to control the power source 122 for producing the ions, as well as the extraction power source 126, wherein the ion beam path P is generally controlled. The controller 142, for example, is further operable to adjust the strength and orientation of the magnetic field associated with the mass analyzer 136, among other things. In another example, the controller 142 is further operable to control a position of the workpiece 110 within the end station 106, and can be further configured to control a transfer of the workpiece between the end station 106 and an external environment 143. It will be appreciated that the controller 142 may comprise a processor, computer system, and/or operator for overall control of the system 100 (e.g., a computer system in conjunction with input by an operator).

Undesirable species of ions having an atomic mass much larger or much smaller than the desired ion atomic mass are sharply deflected from the desired beam path P within the beamguide 135 of FIG. 1, and generally do not exit the beamguide. However, if the atomic mass of an undesirable ion closely approximates the atomic mass of the desired species, the trajectory of the undesirable ion will be only slightly deflected from the desired beam path P. Accordingly, such an undesirable ion having only a slight deflection from the desired beam path P would have a tendency to impact an upstream facing surface 144 of the resolving aperture 140. In a high-current ion implantation system 100, a length of the beam path P is relatively short, and a deceleration of the ion beam 114 (e.g., called "decel mode"), is often desired just prior to the ion beam impacting the workpiece 110. In such a system, a decel suppression plate 146 is provided downstream of the resolving plate 138, wherein a decel suppression voltage $V_{Decel}$ provided by a decel suppression voltage supply 148 generally decelerates the ion beam and prevents electrons from traveling upstream along the beamline P. A ground plate 150 is further provided downstream of the decel suppression plate 146 in order to neutralize downstream effects of the decel suppression plate 146. The decel suppression plate 146 and ground plate 150, for example, are further utilized as optics in order to focus the decelerated ion beam 114. It should be noted that while the decel suppression plate 146 is utilized in one example to provide deceleration and/or suppression of the ion beam, the decel suppression plate can be comprised of any electrically biased plate and/or aperture, and all such plates and/or apertures are contemplated as falling within the scope of the present invention.

In accordance with one example, the decel suppression voltage $V_{Decel}$ applied to the decel suppression plate generally determines an amount of electrons in a plasma sheath surrounding the ion beam 114. Upon removing a sufficient number of electrons from the ion beam 114, for example, a condition known as beam "blow-up" can occur, which refers to the tendency for like-charged (positive) ions within the ion beam to mutually repel each other (also known as the space charge effect). Such mutual repulsion causes an ion beam of otherwise desired shape to diverge away from an intended beamline path P. Accordingly, the decel suppression plate 146 further provides optical focusing of the ion beam when electrons are stripped from the ion beam 114, and a height and width of the ion beam is generally determined based, at least in part, on the quantity of electrons stripped from the ion beam and/or focusing optics associated with the decel suppression plate In another example, a plasma electron flood (PEF) enclosure 152 is further positioned downstream of the aperture ground plate 150 along the ion beam path P, wherein the PEF enclosure is configured to provide electrons to the ion beam 114 in order to control charges on the workpiece 110, while also controlling space charges associated with the ion beam to in order to control ion beam blow-up or expansion near the workpiece. In accordance with another example, the PEF enclosure 152 comprises a louvered enclosure 154.

During operation of the ion implantation system 100, contaminant materials such as undesirable species of ions, sputtered carbon from the resolving aperture 140, beamguide 135, etc., dopant material from the ion source 120, as well as sputtered photoresist and silicon from the workpiece 110 will tend to build up on one or more interior surfaces 156 of the ion implantation system adjacent the ion beam 114. In particular, upstream facing and cross-sectional surfaces 158 shown in FIG. 2 of the resolving plate 138 around the resolving aperture 140 have a tendency to build up contaminant materials (not shown) after repeated ion implantations into workpieces 110. Further, photoresist material from the workpieces 110 themselves may also build up on the interior surfaces 156 of the ion implantation apparatus 100.

Build up of contaminant materials on the one or more interior surfaces 156 associated with components between the resolving plate 138 and the end station 106 has a tendency to eventually flake off during implantation, thus creating disadvantageous electrical discharges and particulate problems.

Furthermore, contaminant build up around the resolving aperture 140 further causes desirable ions near the outer extremities of the beam path P to strike and dislodge the built up contaminants. The dislodged contaminants can further travel to the surface of the workpiece 110, thus potentially causing various undesirable effects on the resulting implanted workpiece. The dislodged contaminants, for example, can further enter a high electric field produced by components such as the decel suppression plate 150, therein causing deleterious arcing which generates additional particles. Ion beam blow-up may further pick up and transport particles from surfaces normally outside the path of the ion beam. Accordingly, such disruptions in the transport of the ion beam 114 have great potential to adversely affect dose uniformity and overall quality of the implanted workpiece 110.

Figure 3:
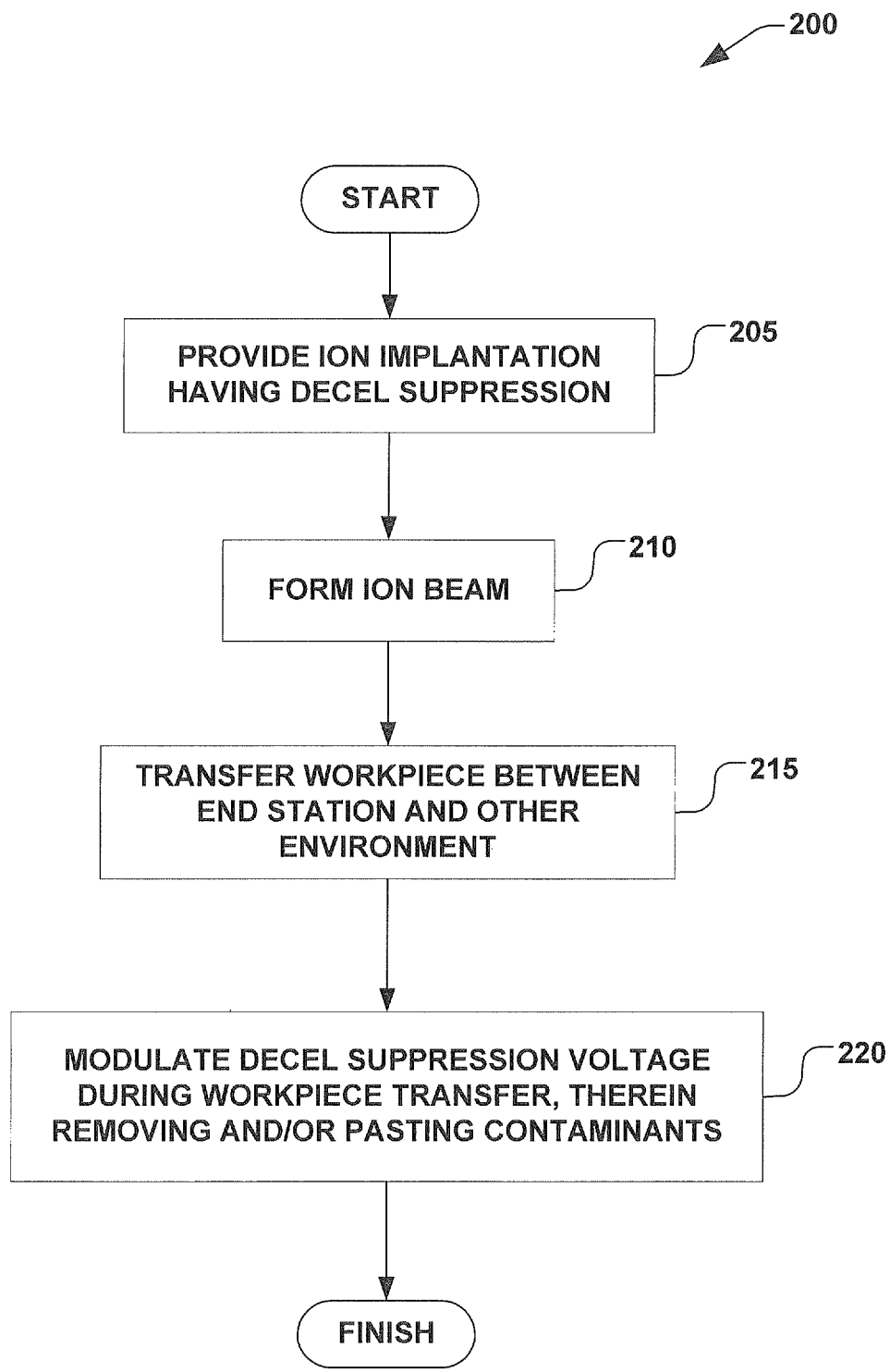
FIG. 3 is a block diagram of an exemplary method for reducing particle contamination during an implantation of ions into one or more workpieces according to another exemplary aspect of the invention.

Thus, In accordance with another aspect of the present invention, FIG. 3 illustrates a exemplary method 200 for reducing particle contamination imparted to a workpiece in an ion implantation system. While exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

As illustrated in FIG. 3, the method 300 begins with providing an ion implantation system in act 205, wherein the ion implantation system is configured to implant ions into the one or more workpieces via an ion beam, such as the ion implantation system 100 FIGS. 1-2. Although the ion implantation system 100 of FIGS. 1-2 is illustrated as one example, various other ion implantation systems having similar or dissimilar components can be provided for the implantation of the presently described method, and all such ion implantation systems are contemplated as falling within the scope of the present invention. The ion implantation system provided in act 205, for example, comprises an ion source, a resolving aperture positioned proximate to an exit of a mass analyzer, a decel suppression plate positioned downstream of the resolving aperture, and an end station configured to support a workpiece during an implantation of ions thereto.

In accordance with one example, an ion beam is formed in act 210 via the ion source. A decel suppression voltage is further applied to the decel suppression plate wherein electrons are selectively stripped from the ion beam and the ion beam is generally focused, as described above. A workpiece positioned downstream of the decel suppression plate, for example, is thus implanted with ions from the decelerated ion beam. Once sufficient implantation is complete, the workpiece is transferred from the end station and an external environment in act 215, and another workpiece can be transferred from the external environment into the end station for ion implantation thereto.

In accordance with the invention, generally concurrent with the transferring of the workpiece into or out of the end station of act 215, the decel suppression voltage being applied to the decel suppression plate is modulated in act 220, therein expanding and contracting the ion beam. Act 220 advantageously occurs concurrent with a period of time when the workpiece is transferred between the end station and an external environment (e.g., during an exchange of workpieces in act 215), therein mitigating a potential for workpiece contamination due to materials being transported to the workpiece via the ion beam.

During the expansion and contraction of the ion beam of act 220, for example, one or more surfaces of at least the resolving aperture are impacted by the expanding and contracting ion beam. For example, the resolving aperture, decel suppression plate and any ground reference apertures or other assemblies situated downstream of the resolving aperture are impacted by the expanding and contracting ion beam during act 220. By modulating the decel suppression voltage in act 220, material previously deposited (e.g., sputtered) onto one or more surfaces associated with the resolving aperture, decel suppression plate and any ground reference apertures or other assemblies situated downstream of the resolving aperture is generally mitigated, as will be described further, infra.

Thus, the decel suppression voltage is modulated between a maximum voltage and a minimum voltage, therein expanding and contracting the ion beam through cross-sections of the resolving aperture, decel suppression plate and any ground reference apertures or other assemblies situated downstream of the resolving aperture, without contaminating the workpiece and also minimizing downtime of the ion implantation system. Accordingly, the ion beam is generally swept across the resolving aperture and/or components positioned downstream of the resolving aperture. The expansion and contraction of the ion beam thus causes the ion beam to impact the one or more surfaces of at least the resolving aperture, therein generally sputtering-clean previously deposited material, and/or strongly adhering or pasting the previously deposited material to the one or more surfaces, therein minimizing chances for delamination of the deposited material due to film stress. Whether the previously deposited material is removed or more strongly adhered to the one or more surfaces, for example, is determined by the energy or mass of the particular ion beam utilized. Regardless, the present invention mitigates the potential for the previously deposited materials to deleteriously impact the workpiece during a subsequent ion implantation.

In one example, at least a front and side surface of the resolving aperture is impacted with the expanding and contracting ion beam, therein sputtering clean at least the front and side surfaces of the resolving aperture. Accordingly, in the present example, it is advantageous that the ion beam is not extinguished during the workpiece transfer. Further, it is noted that modulating the decel suppression voltage generally does not substantially affect the ion beam upstream of the resolving aperture.

In accordance with yet another exemplary aspect, act 220 comprises modulating the decel suppression voltage between zero volts and some operating suppression voltage (e.g., 15 keV). The operating suppression voltage, for example, is generally the decel suppression voltage utilized during ion implantation into a workpiece. The modulation of the decel suppression voltage, for example, is cycled one or more cycles during the transferring of workpieces. The transferring of the workpiece between the end station and an external environment, for example, can be accomplished in less than approximately three seconds, wherein the decel suppression voltage is modulated within the less than approximately three seconds, and returned to the desired decel suppression voltage once the workpiece is ready to be implanted with ions.

In accordance with still another exemplary aspect, the ion implantation system provided in act 205 further comprises a plasma electron flood enclosure, wherein at least one or more surfaces of the plasma electron flood enclosure are further impacted by the expanding and contracting ion beam of act 220, therein generally removing previously sputtered/deposited material and/or particles residing thereon. For example, act 220 provides for a base of the plasma flood assembly or downstream enclosure to be cleaned by impacting the one or more surfaces associated with the plasma flood assembly or downstream enclosure, therein dislodging small particles from the associated surfaces. The dislodging or movement of the small particles, for example, is further generally sufficient to allow the particles to fall through holes or openings in the plasma flood assembly, therein generally removing the contamination from the plasma flood assembly. According to still another example, a determination is made as to whether the deposited materials are to be sputtered from the one or more surfaces or intentionally more strongly adhered (e.g., "pasted") to the one or more surfaces. By pasting the deposited materials to the one or more surfaces, the deposited materials are less likely to be sputtered away during subsequent processing of workpieces. The determination of whether to sputter or paste the deposited materials is made based, at least in part, on the desired ion beam energy and/or characteristics (e.g., mass) of the species being implanted.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method for reducing particle contamination in an ion implantation system, the method comprising:
   providing an ion implantation system having an ion source, a resolving aperture positioned proximate to an exit of a mass analyzer, a decel suppression plate positioned downstream of the resolving aperture, and an end station configured to support a workpiece during an implantation of ions thereto;
   forming an ion beam via the ion source;
   applying a decel suppression voltage to the decel suppression plate, therein selectively stripping electrons from the ion beam and focusing the ion beam;
   transferring the workpiece between the end station and an external environment; and
   modulating the decel suppression voltage between a non-zero minimum voltage and a maximum voltage generally concurrent with the transferring of the workpiece, therein expanding and contracting a height and/or width of the ion beam but not extinguishing the ion beam, wherein one or more surfaces of the resolving aperture are impacted by the expanding and contracting ion beam, therein generally mitigating subsequent contamination of workpieces from previously deposited material residing on the one or more surfaces.

2. The method of claim 1, wherein the decel suppression voltage concurrently affects a removal of electrons from the ion beam and a focusing of the ion beam, wherein an effect of the modulation of the decel suppression voltage on the ion beam results in a net modulation of the height and/or width of the ion beam over a range of decel suppression voltages.

3. The method of claim 1, wherein modulating the decel suppression voltage comprises varying the decel suppression voltage between the non-zero minimum voltage and an operating suppression voltage.

4. The method of claim 1, wherein modulating the decel suppression voltage comprises cyclically varying the decel suppression voltage for one or more cycles.

5. The method of claim 1, wherein modulating the decel suppression voltage generally does not affect the ion beam upstream of the resolving aperture.

6. The method of claim 1, wherein the one or more surfaces of the resolving aperture comprises at least a front and side surface of the resolving aperture.

7. The method of claim 1, wherein transferring the workpiece between the end station and an external environment takes less than approximately three seconds.

8. The method of claim 1, wherein the ion implantation system further comprises a plasma electron flood enclosure, and wherein at least one or more surfaces of the plasma electron flood enclosure are impacted by the expanding and contracting ion beam, therein generally removing previously deposited material residing thereon.

9. The method of claim 8, wherein the previously deposited material falls through one or more openings in the plasma electron flood enclosure.

10. The method of claim 1, wherein modulating the decel suppression voltage generally removes the previously deposited material from the one or more surfaces.

11. The method of claim 1, wherein modulating the decel suppression voltage generally increases an adherence of the previously deposited material to the one or more surfaces.

12. A method for reducing particle contamination in an ion implantation system, the method comprising:
    providing an ion implantation system having a source, mass analyzer, a resolving aperture positioned proximate to an exit of the mass analyzer, a decel suppression plate positioned downstream of the resolving aperture, and an end station;
    forming an ion beam via the ion source;
    transferring a workpiece into the end station from an external environment;
    applying a decel suppression voltage to the decel suppression plate, wherein electrons are generally stripped from the ion beam prior to the ion beam impacting the workpiece;
    implanting decelerated ions from the ion beam into the workpiece;
    transferring the workpiece from the end station to the external environment; and
    modulating the decel suppression voltage between a non-zero minimum voltage and a maximum voltage concurrent with the workpiece transfer into and out of the end station, therein causing the ion beam to expand and contract between a first and second non-zero height and width, wherein one or more surfaces of the resolving aperture and/or one or more components downstream of the resolving aperture are impacted by the expanding and contracting ion beam, therein generally mitigating subsequent contamination of workpieces from previously deposited material residing on the one or more surfaces.

13. The method of claim 12, wherein modulating the decel suppression voltage comprises varying the decel suppression voltage between the non-zero minimum voltage and an operating suppression voltage.

14. The method of claim 12, wherein modulating the decel suppression voltage comprises cyclically varying the decel suppression voltage for one or more cycles.

15. The method of claim 12, wherein modulating the decel suppression voltage generally removes the previously deposited material from the one or more surfaces.

16. The method of claim 12, wherein modulating the decel suppression voltage generally increases an adherence of the previously deposited material to the one or more surfaces.

17. The method of claim 12, wherein transferring the workpiece between the end station and the external environment takes less than approximately three seconds.

18. The method of claim 12, wherein the one or more components downstream of the resolving aperture comprises a plasma electron flood enclosure, and wherein at least one or more surfaces of the plasma electron flood enclosure are impacted by the expanding and contracting ion beam, therein generally removing previously deposited material residing thereon.

19. A system for reducing particle contamination during implantation of ions into a workpiece, the system comprising:
    an ion implantation system configure to form an ion beam, the ion implantation system having an ion source, a resolving aperture positioned proximate to an exit of a mass analyzer, a decel suppression plate positioned downstream of the resolving aperture, a decel suppression voltage supply, and an end station configured to support a workpiece during an implantation of ions into the workpiece via the ion beam;
    a decel suppression voltage supply operably coupled to the decel suppression plate, wherein a predetermined decel suppression voltage supplied to the decel suppression plate is operable to strip electrons from the ion beam based on the decel suppression voltage;
    a transfer mechanism configured to transfer the workpiece between the end station and an external environment; and
    a controller configured to selectively modulate the decel suppression voltage between a predetermined non-zero low voltage and the predetermined decel suppression voltage generally concurrent with the transferring of the workpiece, therein expanding and contracting the ion beam, wherein one or more surfaces of at least the resolving aperture are impacted by the expanding and contracting ion beam, therein generally mitigating subsequent contamination of workpieces from previously deposited material residing on the one or more surfaces.

20. The system of claim 19, wherein the controller is configured to selectively cyclically modulate the decel suppression voltage between the non-zero low voltage and the predetermined decel suppression voltage generally concurrent with the transferring of the workpiece between the end station and the external environment.

* * * * *